(12) United States Patent
Manstretta et al.

(10) Patent No.: US 6,418,051 B2
(45) Date of Patent: Jul. 9, 2002

(54) NON-VOLATILE MEMORY DEVICE WITH CONFIGURABLE ROW REDUNDANCY (75) Inventors: Alessandro Manstretta, Broni; Rino Micheloni, Turate; Andrea Pierin, Graffignana; Emilio Yero, Vimercate, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/785,079

(22) Filed: Feb. 14, 2001

(30) Foreign Application Priority Data

Feb. 14, 2000 (EP) .............................. 00830103

(51) Int. Cl.$^7$ .............................. G11C 16/06; G11C 7/00
(52) U.S. Cl. .............................. 365/185.09; 365/185.11; 365/200
(58) Field of Search .............................. 365/200, 185.09, 365/185.11

(56) References Cited

U.S. PATENT DOCUMENTS

| 4,975,882 A | 12/1990 | Kuo et al. ................. 365/200 |
| 5,396,124 A | 3/1995 | Sawada et al. ............... 326/13 |
| 5,513,136 A * | 4/1996 | Fandrich et al. ........ 365/185.09 |
| 5,579,265 A * | 11/1996 | Devin ......................... 365/200 |
| 5,617,364 A * | 4/1997 | Hatakeyama .......... 365/185.09 |
| 5,862,086 A | 1/1999 | Makimura et al. .......... 365/200 |
| 6,018,482 A | 1/2000 | Fujita ......................... 365/200 |
| 6,301,152 B1 * | 10/2001 | Campardo et al. ..... 365/185.09 |

* cited by examiner

Primary Examiner—Trong Phan
(74) Attorney, Agent, or Firm—Lisa K. Jorgenson; Robert Iannucci; Seed IP Law Group, PLLC (57) ABSTRACT

A non-volatile memory device with configurable row redundancy includes a non-volatile memory having a matrix of memory cells and a matrix of redundant memory cells, both organized into rows and columns. The memory device also includes row and column decoding circuits; read and modify circuits for reading and modifying data stored in the memory cells; and at least one associative memory matrix, also organized into rows and columns, able to store the addresses of faulty rows, and control circuits for controlling the associative memory matrix. The memory device further includes a circuit for recognizing and comparing selected row addresses with faulty row addresses contained in the associative memory matrix, such as to produce de-selection of the faulty row and selection of the corresponding redundant cell row in the event of a valid recognition; and a configuration register, also comprising a matrix of non-volatile memory cells, and associated control circuits.

20 Claims, 3 Drawing Sheets

NON-VOLATILE MEMORY DEVICE WITH CONFIGURABLE ROW REDUNDANCY

TECHNICAL FIELD

This invention relates to a non-volatile memory device with configurable row redundancy.

The invention relates, particularly but not exclusively, to semiconductor non-volatile memory devices which are electrically programmable and fabricated with CMOS technology, and the following description is made with reference to this field of application for convenience of explanation only.

BACKGROUND OF THE INVENTION

As it is well known, a semiconductor non-volatile memory device of the so-called "multimegabit" type, such as EEPROMs or Flash EPROMs, basically comprises a matrix of memory cells which accounts for a good proportion of the device area, specifically 40 to 70% of its total area.

The applications of such memory devices impose perfect performance of all the memory cells in the matrix during the device operation phases (reading, programming, erasing). In principle, the presence of at least one inoperative memory cell, commonly defined as "bit-fail", is sufficient to put the whole device out of use.

This requisite for utmost reliability of the memory device taxes the manufacture of this type of integrated device, because a generic memory cell in a batch has a not null probability of turning up defective. In particular, the main causes of bit-fails are connected to the technological process used to fabricate the integrated device, e.g., conductive layers shorted together, variations in the process parameters, breakdown of dielectric layers, and so on.

Lacking arrangements to detect and correct bit-fails, the percentage of devices with properly performing memory cells in a chosen fabricating batch would be low to qualify for mass production methods. This percentage shows the so called prime yield of the fabricating batch and plays a very important role in the whole manufacturing process.

In memory devices, this yield is actually dependent on the faultiness spread not only through the cell matrix interior, but also through ancillary circuits to such matrix. However, in consideration of the large area occupied by the memory, the reduced yield in devices of this type is mainly due to faults occurring within the matrix.

Suitable circuit arrangements for the detection and the correction of bit-fail are therefore employed to increase the yield in integrated memory devices.

According to a commonly used technique, spare memory cells are provided to replace those cells which have been found faulty in the matrix.

These spare memory cells, usually called redundant, are identical to the matrix memory cells they have to replace, and are suitably controlled by dedicated control circuits added to the standard device circuitry.

In particular, the memory layout prompts the use of entire redundant cell rows or columns, so that corresponding rows or columns of the memory matrix can be replaced even on the occurrence of only one bit-fail therein. In this way, a good compromise can be made between fault-correcting capability and the requested area to perform redundancy control circuits.

The choice of the type of layout of redundant cells for use in a memory device, e.g., row redundancy or column redundancy, or both, is essentially tied to the knowledge of the distribution and typology of the faults appearing in the matrix for a given technological integration process.

Moreover, the yield of a silicon integration process is not constant over time, since it is dependent on the actions performed to improve both the process characteristics and the circuit functional aspects. Typically, the yield is comparatively low at the start of the manufacturing process, to then improve as the production volume increases following to the process optimizing actions.

For example, with a well developed integration technology widely employed for mass production, the yield may attain its highest possible levels.

Of course, it is important to keep the manufacturing yield in memory devices high, possibly also from the very start of the manufacturing process.

In addition, every increase of the corrective capability of a redundancy architecture associated with a matrix of memory cells provokes an increase of the required area for its control circuitry, as well as an increase of the weight of the whole device complexity.

This added complexity becomes a serious problem with the row redundancy techniques, which heavily penalize, moreover, the access time to a memory word.

Thus, prior approaches provide optimal designed architectures for a given degree of the corrective capability, which degree is, therefore, fixed and unvaried for all the devices being manufactured.

In practice, implementing specific solutions with a high corrective capability involves an unacceptable longer time for accessing memory words, besides an increase in silicon area occupation, because of the complex control arrangements required.

Figure 1:
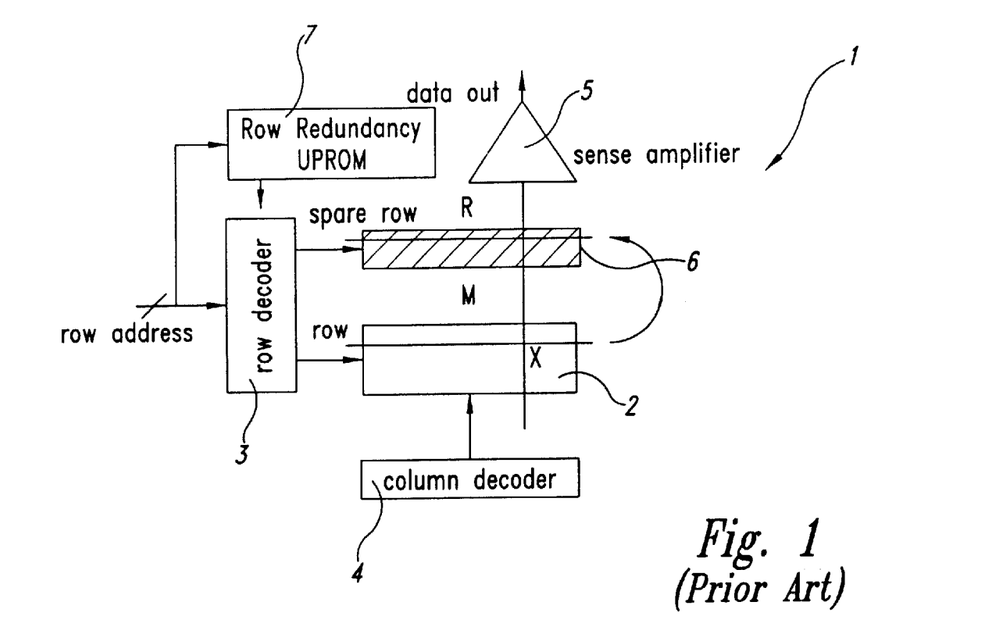
FIG. 1 schematically shows a memory device with redundancy, according to the prior art.

One prior architecture aimed to reduced the access time of high corrective capability solutions making use of redundant rows is schematically shown in FIG. 1.

Particularly, the architecture 1 comprises a matrix 2, called matrix sector, of memory cells which are organized into regular rows and columns, a row decoder block 3, and a column decoder block 4, as well as a read block 5.

The read block 5 comprises basically read circuits (sense amplifiers) and output buffers.

The architecture 1 further comprises at least one matrix 6 of redundant cells, called redundancy sector, operative to correct bit-fails spread with equal probability over all the sectors of matrix 2.

The architecture 1 finally comprises a memory 7 of the UPROM (Unreasonable Programmable Read-Only Memory) type for row redundancy.

It should be considered that in a flash memory device, there are usually many sectors of memory cells having predetermined capacity. In fact the storage capacity of the sectors can be constant for all sectors or vary between sectors.

This organization in sectors allows each cell matrix to be accessed separately for read, program and erase operations. In particular, whereas a program operation is selective of byte/memory words for any memory sector, an erase operation is shared by all the cells of each selected sector.

Selective access to the sectors is, therefore, achieved by providing a row or a column type of organization of the sectors themselves and a physical separation of the source lines of each sector.

In particular, with a by-row organization, the columns are distributed among all the sectors, and the selection takes place by row address, whereas in a dual manner, with a by-column organization, the rows are distributed among all the sectors and the selection takes place by column address.

Furthermore, the by-row or by-column organization of the matrix sectors can be performed by using single or double silicon level technologies. With a by-row organization, rows shared by the sectors are realized in low-resistivity polysilicon, whereas the columns are realized in metal, while with a by-column organization, a second metal level can be used to lower the overall resistance of the polysilicon rows, superposing the metal layer in contact with the polysilicon rows.

In processes with at least two metal levels, the matrix sectors can be organized in a combined by-row and by-column way. In this case, the row (column) decoding can use a hierarchic organization based on "global" rows (columns), or rows shared by all the sectors to which the local rows (columns) of the individual sectors are connected. The local rows (columns) are particularly enabled only for a selected sector.

A hierarchic organization of this type (by the rows or the columns) has a major advantage in that the effects of electric noise on the shared lines between adjoining cells under the different operating conditions are reduced, since the local bit lines or local word lines are shared by the cells of the single sectors.

By using a technological process with at least three metal levels, hierarchic decoding at the same time of the row and of the column is made feasible. In fact, in such a process, the global rows are realized with a first metal level, while the local rows are realized by low-resistivity polysilicon; the global and local columns are instead realized with a second and a third metal level, respectively.

In a conventional architecture 1 as just described, faulty cells are spotted at the device EWS (Electrical Wafer Sorting) stage. In the presence of faulty cells, an associative memory 7, also shown schematically in FIG. 1, is controlled by on-chip control circuitry to allow a full matrix row "replacement" with a redundant row, in such a way that the access to the latter will be fully transparent to the ultimate user.

This replacement operation comprises storing the address of the faulty row permanently into non-volatile memory cells of the UPROM (Unerasable Programmable Read-Only Memory) type of the associative memory 7.

It should be specified that the term UPROM belongs to an EPROM technology wherein the UPROM cells are realized in a different manner from the memory cells, to avoid to erase them during exposure to UV radiation. On the other hand, with a flash technology, the erase operation is of the electrical type, and therefore the UPROM cells realized with such technology are actually identical to the memory cells. Nevertheless, it has become commonplace to use the term UPROM to indicate memory cells employed for storing redundant addresses, as well as in the instance of flash technology.

With the conventional architecture 1, the redundant lines can be pre-decoded by the same row decoding signals of the memory matrix sectors 2, thus achieving a compromise between the corrective capability of the redundancy employed and silicon area occupation.

The solution illustrated by FIG. 1 refers to flash technology implemented with a single or double metallization level technology, with hierarchic column decoding (hierarchic row decoding being non-limitative in application), with redundant cells provided in an associative memory, or rather in a redundant row sector 6, and with a shared source line.

In particular, the common source terminal of the redundant sector is associated with that of the sector which contains faulty cells. This condition is vital to the application because the architecture of a flash memory provides for the redundant cells to be erased simultaneously with those of their related sector.

The time for accessing a memory word in an architecture based on row redundancy is usually longer than that provided by architectures that do not employ such technique, due to the additional time required for redundancy handling (including comparing the row addresses, selecting a redundant row, etc.). This time is of about 10 ns for conventional memory devices and is inclusive of delay in the propagation of signals over interconnecting lines because of the less-than-ideal effects relating to their physical implementation.

Access time, moreover, is longer in a row redundancy architecture than in a column redundancy architecture, due to the different organization of the memory matrix in either cases.

In particular, in multimegabit flash memory devices exhibiting high parallelism during a burst read mode, the memory sectors are designed to include a significantly larger number of columns than of rows. Consequently, the row pre-charge time will be longer than the column time, mainly because of the increased RC load associated therewith.

For a given line load, pre-charge time is proportional to the final voltage sought; in case of reading with a higher gate voltage than the supply voltage Vdd (as in the case of multi-level memories or conventional two-level memories using a so-called gate-boosted reading technique), the penalty is heavier on access time because row pre-charging takes longer.

In order to minimize the effect on access time, the prior solution under consideration provides with a simultaneously pre-charging of both the selected and the redundant row, even where the former does not require to be replaced, at every change of address forced from outside. The evaluation of the redundant event for the selected row is carried out during the row pre-charging time, while the local columns are de-selected. In this way, uniformity of access time can be achieved for both devices provided with redundancy and devices which are not provided with redundancy.

In summary, this prior architecture does enhances the corrective capability of the whole device for only a predetermined number of redundant rows, by virtue of the matrix of memory cells having hierarchic decoding features, in particular of the redundant rows being organized within a dedicated sector with local column decoding.

This particular hierarchic decoding architecture provides, therefore, for optimum handling of row redundancy, maximizing corrective capability without penalty on memory word accessing time. In fact, with this architecture, some functional operations can be arranged to overlap in time, thus reducing the access time to the memory words. The architecture is, therefore, of special advantage with memory devices wherein the time required for pre-charging a selected row is longer than the time for sensing the redundancy event of such a row.

However, the prior solutions are advantageous at the initial stage of the manufacturing process, being justified by the need to obtain a high yield, and become gradually less useful, as the yield improves with the manufacturing process becoming more favorable over time.

SUMMARY OF THE INVENTION

An embodiment of this invention provides a memory architecture having row redundancy control, with such structural and functional features as to afford chip-by-chip re-configurability of the architecture corrective capability, thereby overcoming the drawbacks and limitations of prior art memory architectures.

Thus, the capability to recover faulty cells can be adjusted to fill actual demands during the fabrication of the architecture, achieving the best compromise between the corrective capability of the architecture and its effect on access time to the memory words of a cell matrix with which the architecture is associated.

A principle of this invention is one of configuring each device product at the EWS stage of its fabrication.

An embodiment of the invention is directed to a non-volatile memory device with configurable row redundancy, comprising:
- a non-volatile memory, itself comprising at least one matrix of memory cells and at least one matrix of redundant memory cells, both organized into rows and columns;
- row and column decoding circuits;
- read and modify circuits for reading and modifying data stored in the memory cells; and
- at least one associative memory matrix, also organized into rows and columns, able to store the addresses of faulty rows and related control circuits for controlling the associative memory matrix.

The features and advantages of the device according to the invention can be more clearly understood by reading the following description of an embodiment thereof, given by way of non-limitative example with reference to the accompanying drawings.

DETAILED DESCRIPTION OF THE INVENTION

The following description deals with non-volatile flash memory devices for illustration purposes, it being understood that the expounded considerations equally apply to memory devices of the EPROM or the EEPROM type.

Figure 2:
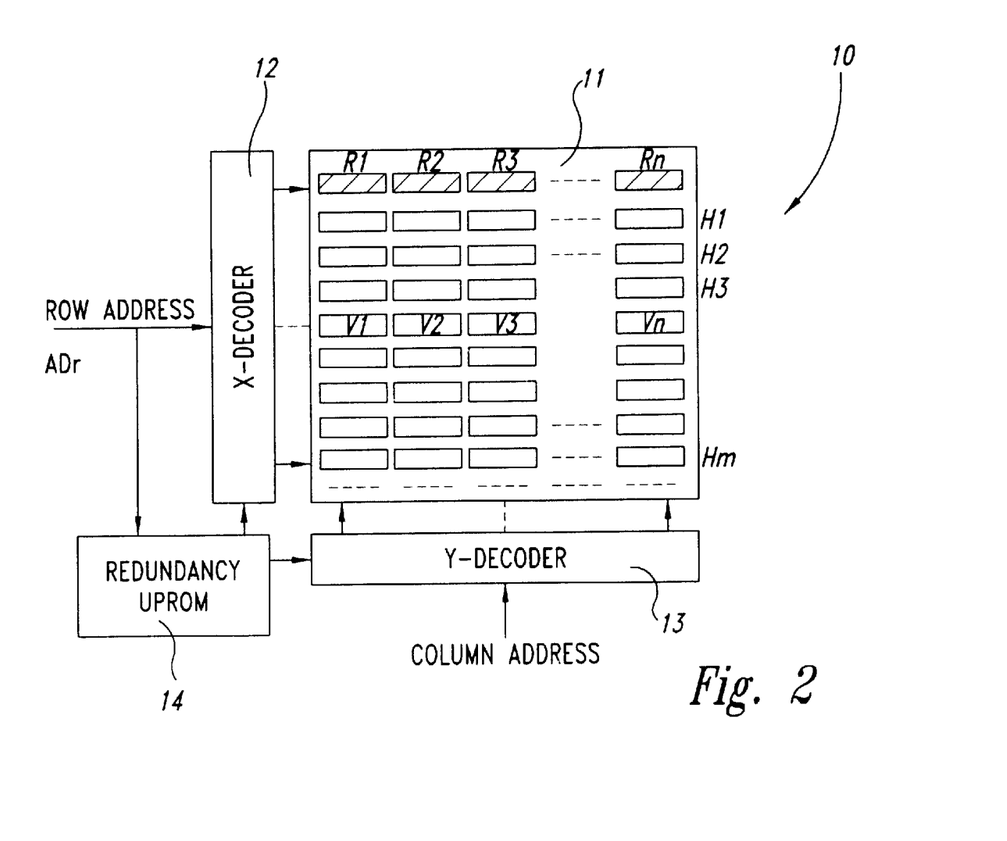
FIG. 2 schematically shows a memory matrix with row redundancy, according to the invention.

Referring to the drawing views, and particularly to FIG. 2, a memory architecture with hierarchic row and column redundancy, according to the invention, is schematically shown generally at 10.

It should be noted that the described architecture is but a non-limitative example of the organization of a memory having hierarchic row and column redundancy. In particular, the architecture 10 comprises a predetermined number Ns of matrix sectors and a predetermined number Nr of redundant rows.

In particular, the architecture 10 is organized into both rows and columns, whereby any sector of such architecture shares rows and columns with each sector lying adjacent to it.

The memory architecture 10 comprises n×m memory sectors, it being n×m=Ns, which are organized as vertical groups of sectors, designated V1, V2 . . . Vn, and horizontal sector groups, designated H1, H2 . . . Hm.

Each vertical sector group V1, V2 . . . Vn is associated with at least one row redundancy sector.

For the sake of simplicity, it will be considered hereinafter that a single redundancy sector is provided for each vertical group, being designated R1, R2 . . . Rn. In practice, a larger number of redundancy sectors can be associated with a single vertical sector group, thereby expanding the corrective capability of the memory architecture 10.

The memory architecture 10 comprises a matrix 11 of memory cells, particularly consisting of the vertical V1, V2 . . . Vn and horizontal H1, H2 . . . Hm groups of memory sectors, the redundancy sectors R1, R2 . . . Rn, global row 12 and column 13 decoders, and an associative matrix 14.

In particular, a row address ADr is supplied to the row decoder 12 and the associative memory matrix 14, the latter being connected to the row and column decoders, 12 and 13.

The architecture 10 employs, for example, a local column decoding facility for both the matrix and the redundancy sectors, such type of decoding facility being neither essential to, nor limitative of, the proposed solution, but merely a preferred embodiment. For simplicity, the local decoding blocks are omitted from the drawing because of no characterizing value to the invention purposes.

In the organization shown in FIG. 2, each sector row is replaced only by a redundant row having the same pre-decoding signals corresponding to it. In addition, to maximize corrective capability for a predetermined number of redundant rows, the number of the sector row decoding signals is set equal to that of the redundant row select signals.

For such purpose, the source lines of the redundant cells are connected with each other, and electrically connected to a voltage generator through a selector circuit, not shown.

When using CMOS technologies, the rows of the flash cell matrices are formed in low-resistivity polysilicon. In technological processes providing for two or three metal levels, the polysilicon lines can be parallel connected to metal lines in order to reduce the overall parasitic resistance of the rows and, hence, the propagation delays, according to a technique known as wordline metal strapping.

In any case, the conductive layers providing the matrix rows have to be formed within the wordline pitch, that is, placed at submicron distances from one another.

This feature of the architecture makes two rows being in physical contact with each other a statistically likely event apt to result in the creation of shorts at one or more spots.

With current integration technologies providing a high degree of control of the lithographic patterning, the spread of faults from the row conductive layers becomes restricted to isolated punctual regions of the matrix. Furthermore, faultiness is higher in the polysilicon lines than the metal-polysilicon lines.

In general, the use of such techniques as the aforementioned metal strapping, in combination with currently available technologies, can bring faultiness to such a low level that redundancy techniques become unnecessary.

Actually, increased levels of faultiness appear at the start of the manufacturing process, and justify the application of a row or column redundancy technique. It is often necessary, in actual practice, to recover a row or a small group of adjoining rows due to local faultiness from the technological process.

As regards the application of the memory architecture 10, two separate cases should be considered:

1) two faulty rows scattered within the same sector occur in Ns sectors;
2) more than two faulty rows scattered in different sectors occur in Ns sectors.

It should be noted that a minimum target of the redundancy technique is the replacement of a fault in a row which is equally likely to be spread through all the rows of the matrix 11; a general target of maximum coverage is instead the correction of a larger number of row faults, located everywhere.

Figure 3A:
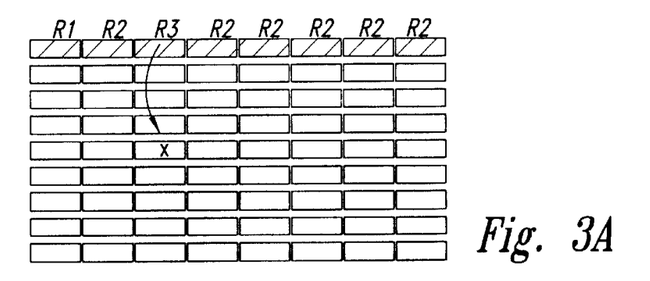
FIGS. 3A and 3B show the memory matrix of FIG. 2 in greater detail.
Figure 3B:
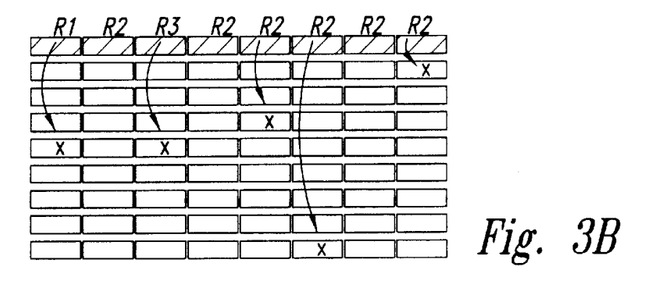

The memory architecture 10 practically affords increased corrective capability since, in the general case, a redundant sector Ri (i=1, 2, . . . , n) can be used to replace just the faulty rows belonging only to the corresponding vertical sector group Vi, as shown in FIGS. 3A and 3B.

In particular, this architecture 10 with row redundancy provides two main fault coverages, in a configurable style:

1.1) n/n;
2.1) 1/n.

In practice, for a memory architecture having Ns=64 memory sectors arranged in n=8 vertical groups and m=8 horizontal sector groups, the configurable corrective capability of an architecture according to the invention is:

1.1) 8/8 recoverable faults from a single sector of 64 sectors;
2.1) 1/8 independently recoverable faults from a single sector of 8 sectors.

FIG. 3 schematically shows, by way of example, an organization of the memory 10, with minimum coverage of 8/8 and maximum coverage of 1/8 for a predetermined number (8) of redundancy sectors.

Architectures can be likewise implemented with corrective capability in between 8/8 and 1/8. For example, it is possible to cover faults located in groups of 16 or 32 sectors (corrective capability of 1/4 and 1/2, respectively).

The choice of the solution to be applied is dependent on the compromise between the corrective capability and the silicon area required by the architecture 10, in particular dependent on the UPROM circuitry associated with the redundancy. In selecting the corrective capability, its effect on the access time to a memory word is also taken into account.

The information about the addresses of faulty rows is stored into non-volatile memory cells included in the associative memory matrix 14 which receives at its input the row address ADr and has its output connected to the decoding blocks 12 and 13.

In particular, each row of the associative memory matrix 14 contains the addresses of the faulty rows of a single sector of a given vertical sector group. Thus, the number of columns varies according to the spare rows available for each sector, as schematically shown in FIG. 4.

Figure 4:
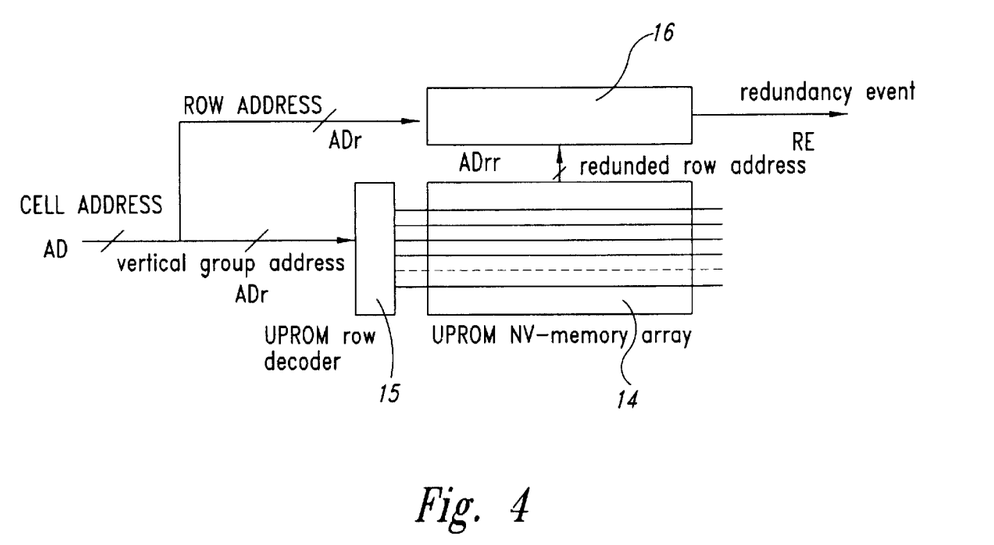
FIG. 4 schematically shows a detail of the memory matrix of FIG. 2.

FIG. 4 shows the associative memory matrix 14, organized, for example, into 8 rows and addressed by means of a dedicated row decoder 15. In particular, a cell address AD is split into a vertical group address ADv which is sent to the dedicated row decoder 15, and a row address ADr which is sent to logic control circuitry 16.

A row address ADrr of the associative memory matrix 14 is then compared with the current row address ADr by the logic control circuitry 16, which outputs a redundancy event signal RE. In particular, if the current row signal ADr happens to be the same as the redundant row signal ADrr, a positive redundancy event RE is signaled effective to control the replacement of faulty rows in a memory matrix 11 associated with the associative memory matrix 14.

Of course, with the architectural layout shown in FIG. 4, only one row at a time of the associative memory matrix 14 can be selected, as is the case with conventional NORed memory architectures. Thus, at each change of row in the associative memory matrix 14, the corresponding memory cells in the memory matrix 11 are read and their addresses compared once again.

It should be noted that, in the instance of 8/8 coverage, bit-fail situations are present only in the same sector within the memory matrix 11.

Accordingly, the positions of faulty rows can be identified during the memory testing and stored into the associative memory matrix 14, using the corresponding portion of the memory address. In this case, a single row of the associative memory matrix 14 is sufficient to store the addresses of the faulty rows, since the latter can only belong to the same vertical sector group.

In particular, this information about the faulty rows can be read cumulatively at the device power-up, or where so provided, during the hardware resetting phase, when an impulse of a predetermined minimum duration is usually applied to a reset pin.

On the other hand, with a 1/8 coverage, bit-fail situations may be present in sectors belonging to different groups of vertical sectors. But in each vertical group, only one sector can be corrected at most. Such faulty row information is, therefore, read by means of an address transition detect (ATD) signal normally provided in circuitry associated with a memory architecture.

In this case, the corrective capability of the memory architecture 10 is multiplied by a factor equal to the number of vertical sector groups.

The situations in the above extreme cases can be summarized as follows:

| Organization | Coverage | Associative matrix reading |
|---|---|---|
| 8/8 | 1 sector/64 | |
| | | Reset |
| 1/8 | 1 sector/8 | ATD |

Figure 5:
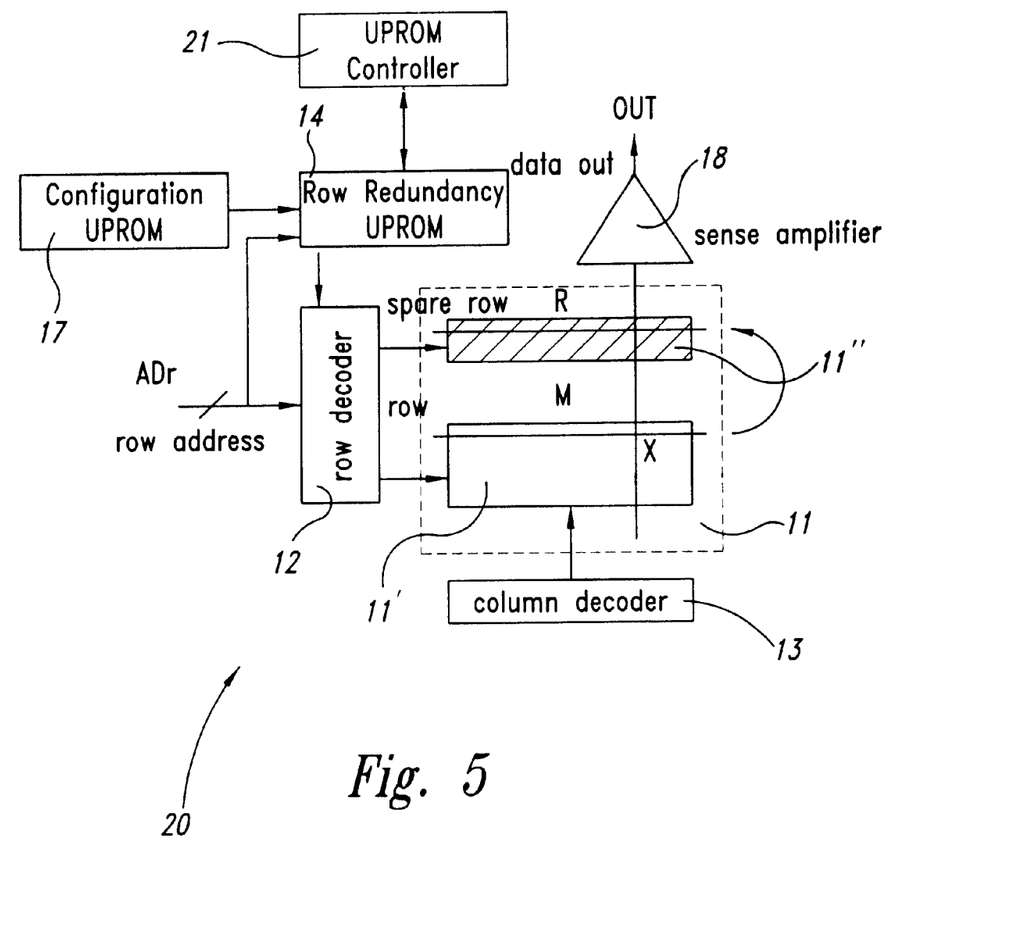
FIG. 5 schematically shows a device incorporating a memory matrix with row redundancy according to the invention.

A non-volatile memory device with configurable row redundancy is schematically shown in FIG. 5 and indicated with 20.

The memory device 20 comprises:

a non-volatile memory 11 consisting of at least one matrix 11' of memory cells and at least one matrix 11" of redundant memory cells, both organized in the row and column form;

row 12 and column 13 decoding circuits;

read and modify circuits for reading and modifying the data stored in the memory cells (not shown because conventional); and at least one associative memory matrix 14, also organized in the row and column form, wherein the addresses of faulty rows can be stored, and associated control circuits therefor.

Advantageously, the memory device 20 further comprises:

at least one circuit 21 for recognizing and comparing selected row addresses ADr with faulty row addresses ADrr contained in the associative memory matrix 14, which circuit can produce de-selection of a faulty row and selection of a corresponding redundant cells row in the event of a valid recognition; and at least one configuration register 17, also comprising a matrix of non-volatile memory cells, and associated control circuits.

In particular, the associative memory matrix 14 receives the row address signal ADr, and is connected to the row decoder 12 and the configuration register 17.

Advantageously, this configuration register 17 is programmed, at the EWS stage, with the performance of the associative memory redundancy matrix 14.

The memory device 20 is then completed with a sense amplifier 18 arranged to generate a data output signal OUT.

Information is read from the associative memory matrix 14, during reading or programming operations of a memory word from/into a matrix, in two different ways:

only once during recovery at the reset or power-up stages of the device (8/8 coverage, for example);

at each change of access address by means of an ADT signal (1/8, 1/4, 1/2 coverages, for example).

During erase operations of a cell matrix, the information read in the associative memory matrix 14 is made only on the matrix address information.

It should be noted that the memory device 20 has column decoding of the hierarchic type, i.e., has a number of main columns which are shared by the memory cell matrix 11' and the redundant cell matrix 11", and has a number of independent local columns for each matrix.

In addition, the cell matrices 11' and 11" share global rows and columns with their adjoining matrices, so that the device would include at least one vertical group of non-volatile memory cell matrices and at least one redundant cell matrix (as previously described in relation to FIG. 2).

In particular, the redundant rows are provided in the dedicated associative memory matrix 14, having local column decoding facilities, while row decoding may be of the conventional or of the hierarchic type. Furthermore, there is at least one row redundancy matrix provided for each vertical group of matrices.

As previously described, a given cell matrix is selected by an address which has a portion for selecting a vertical group of matrices, to which such matrix belongs, and a portion for selecting that matrix among a specific vertical group of matrices.

Advantageously, each row of the associative memory matrix 14 is, moreover, selected univocally by an address of at least one vertical group of cell matrices, according to the corrective capability of the matrix.

To summarize, the disclosed embodiment has the following advantages, whereby:

possibility to configure chip-by-chip the corrective capability of the faulty rows, which can be replaced with identical redundant rows;

the corrective capability can be set at the EWS stage by programming specially dedicated configuration bits into the configuration register 17;

the effect of redundancy on the access time to the memory words can be minimized, this time being only dependent on the evaluation of the redundancy event as a function of the corrective capability of choice (becoming even zero with full coverage).

Furthermore, the fact deserves to be underlined that the memory device 20 has two different modes of operation:

activation of the address comparison during the device resetting [power-on reset or hardware reset] operations, where all the faulty rows are contained in one cell matrix at most of a single vertical group of matrices;

activation of the address comparison during each read operation, where all the rows available for redundancy belong to at least two distinct cell matrices in different vertical groups of matrices.

In addition, by providing the configuration register 17, these modes of operating the associative memory matrix 14 become functions of the informational contents of this register, which contents can be stored independently chip-by-chip.

It is further possible to operate the memory device 20 in the following modes:

activating, at each read or program operation of a memory cell, the comparison of the row address where the memory cell locates and the contents of a given row of the associative memory matrix 14;

at each erase operation of a memory matrix, activating the comparison between the address of the memory matrix and the contents of a given row of the associative memory matrix 14.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A non-volatile memory device with configurable row redundancy, comprising:

a non-volatile memory, itself comprising a matrix of memory cells and a matrix of redundant memory cells, both organized into rows and columns;

row and column decoding circuits coupled to the non-volatile memory;

an associative memory matrix, also organized into rows and columns, the associative memory matrix being structured to store addresses of faulty rows of the non-volatile memory;

a circuit for recognizing and comparing a selected row address with the faulty row addresses contained in the associative memory matrix, and if a matching faulty row address is found, deselecting the faulty row addressed by the matching faulty row address and selecting a corresponding redundant cell row; and a configuration register coupled to the associative memory matrix and comprising a matrix of non-volatile memory cells.

2. A non-volatile memory device with configurable row redundancy according to claim 1, wherein said configuration register is programmed, at an initial testing stage of the device, with information determining how many redundant cell rows are assigned to a section of the matrix of memory cells by the associative memory matrix.

3. A non-volatile memory device with configurable row redundancy according to claim 1, wherein the memory cell matrix and the redundant cell matrix share main cell columns, and each have independent local columns, so that a hierarchic type of column decoding is implemented.

4. A non-volatile memory device with configurable row redundancy according to claim 3, wherein said cell matrices share global rows and columns with adjoining matrices, so that said non-volatile memory comprises at least one vertical group of cell matrices and the redundant cell matrix.

5. A non-volatile memory device with configurable row redundancy according to claim 4, wherein a given one of said cell matrices is selected by an address comprising a portion which selects a vertical group of matrices containing said given cell matrix and a portion which selects said given cell matrix in a determined vertical group of matrices.

6. A non-volatile memory device with configurable row redundancy according to claim 1, wherein each row of the associative memory matrix is selected univocally by an address of at least one vertical group of cell matrices according to a corrective capability of the matrix.

7. A non-volatile memory device with configurable row redundancy according to claim 1, wherein information is read in the associative memory matrix, during operations of reading or programming a memory word in the memory cell matrix, in two different ways:

only once, upon recovery at a device setting stage; and at each change of access address by means of a drive signal.

8. A non-volatile memory device with configurable row redundancy according to claim 1, further comprising a circuit for controlling the associative memory matrix according to two different modes of operation:

activating an address comparison during device resetting operations, where all the faulty rows belong at most to one cell matrix of a single vertical group of matrices; and activating the address comparison during each read operation, where all the faulty rows belong to at least two distinct cell matrices of different vertical groups of matrices.

9. A non-volatile memory device with configurable row redundancy according to claim 8, wherein said modes of operation of the associative memory matrix are functions of contents of said configuration register.

10. A non-volatile memory device with configurable row redundancy according to claim 9, wherein the contents of said configuration register are stored independently on a chip-by-chip basis.

11. A non-volatile memory device with configurable row redundancy according to claim 9, further comprising a circuit for controlling the associative memory matrix for two distinct modes of operation:

activating, at each read or program operation of a selected one of the memory cells, a comparison between an address of the row to which the selected memory cell belongs and contents of a given row of the associative memory matrix; and activating, at each erase operation of a selected one of the memory matrices, a comparison between an address of the memory matrix and contents of a given row of the associative memory matrix.

12. A non-volatile memory device with configurable row redundancy, comprising:

a memory matrix of memory cells organized into rows and columns;

a redundant matrix of redundant memory cells organized into rows and columns;

an associative memory matrix, also organized into rows and columns, the associative memory matrix being structured to store addresses of faulty rows or faulty columns of the memory matrix; and a configuration register coupled to the associative memory matrix and programmed with information determining how many rows or columns of the redundancy matrix are assigned to a section of the memory matrix by the associative memory matrix.

13. The non-volatile memory device of claim 12 wherein the memory matrix and the redundant matrix share main cell columns, and each have independent local columns, thereby implementing a hierarchic column decoding.

14. The non-volatile memory device of claim 12, further comprising:

an associative memory controller having an address input for receiving a requested address of a requested storage location in the memory matrix, the associative memory controller being structured to determine whether the associative memory stores a redunded address corresponding to the requested address, and if the redunded address corresponds to the requested address, then cause a redundant storage location of the redundant matrix to be accessed instead of the requested storage location.

15. The non-volatile memory device of claim 14 wherein the requested address is a first portion of a cell address that also includes a second portion, the memory device further comprising:

an associative memory decoder having an address input for receiving the second portion of the requested address, the associative memory decoder being structured to use the second portion to cause the associative memory to output contents of a storage location corresponding to the second portion, wherein the associative memory controller uses the contents output by the associative memory to determine whether the associative memory stores a redunded address corresponding to the requested address.

16. The non-volatile memory device of claim 14, further comprising:

a memory decoder coupled to the memory matrix, redundant matrix, and associative memory controller, the memory decoder being structured to access the redundant storage location if the memory decoder receives from the associative memory controller a redundancy event signal indicating that the redunded address corresponds to the requested address and the memory decoder being structured to access the requested storage location if the memory decoder does not receive the redundancy event signal from the associative memory controller.

17. A non-volatile memory device with configurable row redundancy, comprising:

a memory matrix of memory cells organized into rows and columns;

a redundant matrix of redundant memory cells organized into rows and columns;

redundancy means for associating a portion of the redundant matrix with a portion of the memory matrix; and configuration means, coupled to the redundancy means, for controlling how many rows or columns of the memory matrix are associated with the portion of the redundancy matrix by the redundancy means.

18. The non-volatile memory device of claim 17 wherein the memory matrix and the redundant matrix share main cell columns, and each have independent local columns, thereby implementing a hierarchic column decoding.

19. The non-volatile memory device of claim 17 wherein the redundancy means includes:

associative memory means for receiving a requested address of a requested storage location in the memory matrix, determining whether the requested storage location is in a section of the memory matrix that includes a faulty storage location, and causing a redundant storage location of the redundant matrix to be accessed instead of the requested storage location if the requested storage location is in a section of the memory matrix that includes a faulty storage location.

20. The non-volatile memory device of claim 19 wherein the redundancy means further includes:

a memory decoder means, coupled to the memory matrix, redundant matrix, and associative matrix means, for accessing the redundant storage location if the memory decoder means receives from the associative matrix means a redundancy event signal indicating that the requested storage location is in a section of the memory matrix that includes a faulty storage location and for accessing the requested storage location if the memory decoder does not receive the redundancy event signal from the associative matrix means.

* * * * *